United States Patent [19]
Vaiden

[11] B 3,982,180
[45] Sept. 21, 1976

[54] APPARATUS FOR TESTING MULTICONDUCTOR CABLES FOR CONTINUITY, CORRECT CONNECTIONS, AND THE ABSENCE OF SHORT CIRCUITS BETWEEN CONDUCTORS.

[75] Inventor: Henry Edge Vaiden, Winston-Salem, N.C.

[73] Assignee: Bell Telephone Laboratories, Incorporated, Murray Hill, N.J.

[22] Filed: Dec. 20, 1974

[21] Appl. No.: 534,767

[44] Published under the second Trial Voluntary Protest Program on February 3, 1976 as document No. B 534,767.

[52] U.S. Cl. .................................. 324/51; 324/66
[51] Int. Cl.² ........................................ G01R 31/02
[58] Field of Search ........................ 324/51, 66, 73

[56] References Cited
UNITED STATES PATENTS

| | | | |
|---|---|---|---|
| 2,635,135 | 4/1953 | Lamont | 324/73 |
| 2,666,898 | 1/1954 | Meldal | 324/66 |
| 2,814,774 | 11/1957 | Wong | 324/51 |
| 2,822,519 | 2/1958 | Murphy | 324/66 |
| 2,964,701 | 12/1960 | Argabright | 324/51 |
| 3,217,244 | 11/1965 | Glover | 324/51 |
| 3,594,635 | 7/1971 | Minamii et al. | 324/51 |
| 3,600,673 | 8/1971 | Kohke | 324/51 |
| 3,728,616 | 4/1973 | Cheek et al. | 324/51 |
| 3,746,973 | 7/1973 | McMahon | 324/51 |
| 3,818,329 | 6/1967 | Reaves | 324/51 |

FOREIGN PATENTS OR APPLICATIONS

| | | | |
|---|---|---|---|
| 189,684 | 4/1957 | Austria | 324/66 |
| 924,432 | 4/1963 | United Kingdom | 324/66 |
| 130,580 | 11/1959 | U.S.S.R. | 324/66 |

*Primary Examiner*—Gerard R. Strecker
*Attorney, Agent, or Firm*—H. L. Logan

[57] ABSTRACT

Apparatus is disclosed for testing a cable by connecting Zener diodes or similar acting structures between terminating contacts at one end of the cable and then selectively connecting a series connected DC voltage source and resistor between terminating contacts at the other end of the cable. The diodes introduce unique voltage drops which determine the current flowing from the voltage source. The magnitude of the current is indicative of the condition of the cable with respect to continuity, correct connections, and interconductor short circuits.

9 Claims, 3 Drawing Figures

APPARATUS FOR TESTING MULTICONDUCTOR CABLES FOR CONTINUITY, CORRECT CONNECTIONS, AND THE ABSENCE OF SHORT CIRCUITS BETWEEN CONDUCTORS

BACKGROUND OF THE INVENTION

1. Field of the Invention

This invention relates to electrical test apparatus for testing multiconductor cables for continuity, correct connections, and the absence of short circuits between conductors.

2. Description of the Prior Art

When multiconductor cables are connected between terminal devices, it is often necessary to perform tests to determine that the individual conductors are correctly connected to the devices, that continuity of conductors exists, and that between-conductor short circuits are not present. A relatively uncomplicated apparatus for performing such tests is disclosed in U.S. Pat. No. 3,217,244, issued to G. G. Glover on Nov. 9, 1965. The Glover apparatus comprises a first test circuit for connection to a first cable terminal device so that the cable conductors are connected by way of lamps, respectively, to a common junction point. The Glover apparatus further comprises a second test circuit for connection to a second cable termination device so that DC voltage is applied, by way of a parallel-connected resistor and lamp, between any one (hereinafter "single") conductor and the remaining conductors, collectively.

When the single conductor is continuous, correctly connected, and not shorted to another conductor, the Glover apparatus causes current to flow in a first direction in the single conductor and in the opposite direction in the remaining conductors. Because all of the current flows through the first test circuit lamp associated with the single conductor, that lamp glows. On the other hand, the current is divided between the remaining lamps so that if any glowing occurs in these lamps it is of a much less intensity. When the single conductor is discontinuous, none of the lamps glows. Furthermore, when the single conductor is misconnected, a lamp other than the expected one glows. Finally, when there is a short between the first conductor and another conductor, the lamp at the second test circuit glows.

One feature of the Glover apparatus is that the remaining conductors in a cable are connected in parallel. This is an advantage in that a good single conductor is indicated as being good notwithstanding that any one or more, but not all, of the remaining conductors is discontinuous, any number of them is misconnected, or any number of them is shorted to one another.

Another feature of the Glover apparatus is that in order to detect discontinuity and crosswiring, visual access to the lamps at the first test circuit is required. In some uses this may prove to be very time consuming. For example, when checking premises which have been prewired for multiple telephone outlets, a single craftsman using such apparatus would be required to make multiple trips between outlets.

SUMMARY OF THE INVENTION

An object of the present invention is to permit a craftsman to test multiconductor cables connected between first and second terminal devices without having to view both devices each time a cable conductor is tested.

This and other objects are achieved by providing unique voltage dropping structures in the first test circuit of the Glover arrangement and by measuring the current at the second test circuit to obtain the necessary diagnostic information.

The unique voltage dropping structures are provided in the first test circuit so that they are connected between the cable conductors, respectively, and the common junction point when the first test circuit is connected to the first terminal device. The structures, in response to current flowing in first and second directions therethrough, have appearing thereacross first and second voltage drops, respectively, where the first voltage drops are all unique with respect to one another for the same value of first direction currents, the second voltage drops are all substantially equal for values of second direction currents within a range of current values, and the first voltage drops are greater than the second voltage drops. The structures are connected in the first circuit so that either of the first currents or all of the second currents flow toward the common junction point.

The unique voltage dropping structures may take any one of several forms. A preferred form is a Zener diode. Another form comprises a plurality of serially connected conventional diodes all poled in the same direction and an additional diode connected in parallel with the serially connected combination and poled oppositely with respect thereto. Still another form comprises a resistor and a diode connected in parallel.

The lamps shown in the Glover arrangement may be present or, if preferred, may be replaced by short-circuit connections.

In a preferred embodiment of the invention, a first test circuit is provided for connection to a first cable terminal device so that the cable conductors are connected by way of Zener diodes, respectively, to a common junction point. These diodes have dissimilar Zener breakdown voltages and are all poled in the same sense with respect to the common junction point. In this embodiment, a second test circuit is provided for connection to a second cable terminal device to series connect between any single conductor and the remaining conductors, collectively, a resistor, a current meter, and a DC voltage source. This source is poled so as to cause the Zener diode connected at the opposite end of the single conductor to experience a Zener breakdown when that conductor is continuous, correctly connected, and not short-circuited to another conductor. This breakdown results in a unique meter indication. When the single conductor is noncontinuous, incorrectly connected, or shorted to another conductor, other meter indications are produced. A meter indication produced for each conductor selected as the single conductor thus permits a single craftsman to test all conductors without having to have visual access to both terminal devices.

DESCRIPTION OF THE DISCLOSED EMBODIMENT

Figure 1:
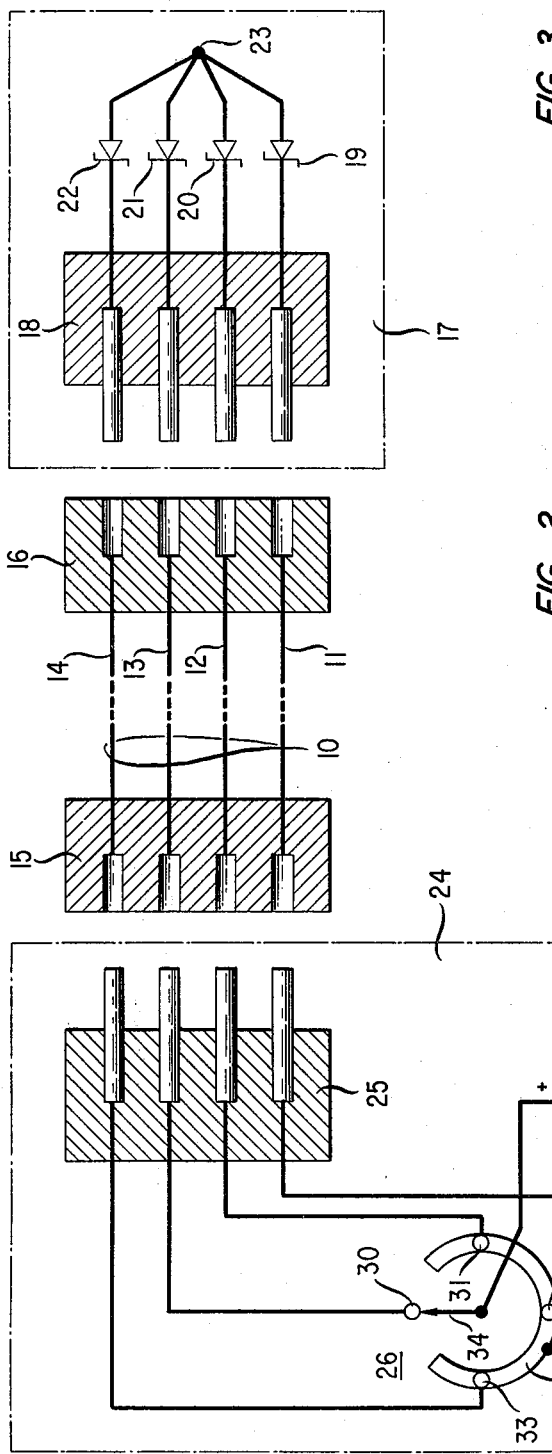
FIG. 1 discloses an embodiment of the invention connected to a multiconductor cable under test.

FIG. 1 shows a cable 10 comprising four conductors 11, 12, 13, and 14. The cable extremities are terminated in terminal devices 15 and 16. In a building prewired for multiple telephone outlets, for example, devices 15 and 16 comprise two out of a plurality of telephone jacks while cable 10 comprises a segment of the telephone cable interconnecting all of the jacks. Normally such jacks are in separate rooms so that one jack is not visible from the other jack.

In accordance with the invention, a first test circuit 17 is connected to terminal device 16. Circuit 17 connects conductors 11, 12, 13, and 14 through a plug 18 and by way of Zener diodes 19, 20, 21, and 22, respectively, to a common junction point 23. Diodes 19, 20, 21, and 22 have dissimilar Zener breakdown voltages such as 6.2, 9.1, 12.0, and 15.0 volts, respectively. These diodes are all poled in the same sense with respect to point 23. A second test circuit 24 is connected to terminal device 15. This second circuit includes a plug 25 for connection to device 15 and a switch 26 which function to series connect between any single conductor and the remaining conductors, collectively, a resister 27, a current meter 28, and a DC voltage source 29.

Switch 26 comprises four stationary contacts 30, 31, 32, and 33, a wiper arm 34, and a ring segment 35. Wiper arm 34 and ring segment 35 are mechanically interconnected so that they are rotatable in unison by an unillustrated knob. As shown, arm 34 connects source 29 to contact 30, which in turn is connected to conductor 13. Furthermore, as shown, ring segment 35 connects resistor 27 to contacts 31, 32, and 33, which in turn are connected to conductors 11, 12, and 14. In this position of switch 26, conductor 13 comprises the "single" conductor while conductors 11, 12, and 14 comprise the "remaining" conductors. When arm 34 and ring segment 35 are rotated in 90° clockwise steps, conductors 12, 11, and 14 in turn are selected as the single conductors. Such switching structure and action is well known in the art. Other switching arrangements for performing this function may, of course, be used in place of the disclosed arrangement.

Source 29 is poled so as to cause the Zener diode connected at the opposite end of any one of conductors 11, 12, 13, and 14 to experience a Zener breakdown when that conductor is selected as the single conductor and it is continuous, correctly connected, and not short-circuited to another conductor.

When cable 10 and terminal devices 15 and 18 do not have any faults, the voltage applied between any conductor selected as the single conductor and the remaining conductors, collectively, causes the Zener diode connected to the single conductor to experience a Zener breakdown and at least one of the remaining diodes to merely conduct in a forward-biased sense. The diode experiencing the Zener breakdown introduces a voltage drop unique to that diode while the forward conducting diode(s) always introduces about a 0.8 volt drop. This results in a current equal to:

$$\frac{E_s - 0.8 - E_z}{R}$$

where:

$E_s$ is the voltage of source 29;

0.8 is the voltage drop of a forward conducting Zener diode;

$E_z$ is the Zener breakdown voltage of the diode connected to the single conductor; and R is the resistance of resistor 27.

From this it is believed apparent that meter 28 produces a unique indication for each of conductors 11, 12, 13, and 14 selected as the single conductor by switch 26.

When a short circuit exists between two conductors, a current indication of $E_s/R$ is produced when each of the two shorting conductors is selected as the single conductor. The shorting conductors are thus identified. On the other hand, a lack of conductor continuity is indicated by a zero current indication when that conductor is selected as the single conductor. Finally, a misconnection of a conductor is indicated by a unique reading other than the one expected when the offending conductor is selected as the single conductor.

An indication of the current flowing from source 29 may also be obtained by replacing meter 28 with a wire and connecting a voltmeter between arm 34 and ring segment 35. The disadvantage of this arrangement is that the voltmeter must be disconnected when testing is not being done as the meter would otherwise drain source 29 as it would be continuously connected across the series connected resistor 27 and source 29.

It should be noted that lamps 51 through 55 of the Glover arrangement may be present in the disclosed embodiment of the invention; i.e., lamp and Zener diode series combinations may be connected between the cable conductors, respectively, and common junction point 23. Using standard engineering skills, components may be selected so that these lamps perform in accordance with the Glover teachings. In particular, components may be chosen so that the maximum currents (which are now different from one another) through the lamps cause the lamps to glow. Diagnostic readings may thus be made at either extremity of the cable under test.

Figure 2:
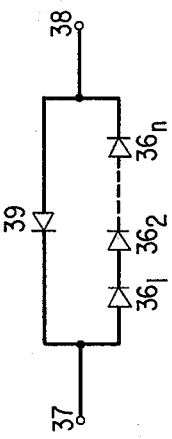
FIG. 2 and 3 show structures which may be used in place of the Zener diodes in the embodiment of FIG. 1.

In accordance with the invention, the structure of FIG. 2 may be used in place of each Zener diode of the embodiment of FIG. 1. FIG. 2 shows a combination of conventional diodes $36_l$ through $36_n$ connected in series between terminals 37 and 38 and all poled in the same direction. An additional conventional diode 39 is connected in parallel with the series connected diodes. This additional diode is poled in the opposite direction. When current flows from terminal 37 to terminal 38, the voltage drop between these terminals is approximately $n$ times the voltage drop which occurs when current flows from terminal 38 to terminal 37. The number of series connected diodes therefore determines the voltage drop for current flowing from terminal 37 to terminal 38. When structures in accordance with FIG. 2 are used in practicing the present invention, they are connected so that current flows through the series connected diodes of any one of the structures when the conductor to which that structure is connected comprises the "single" conductor. Furthermore, different series combinations of diodes are used so as to introduce unique voltage drops as discussed with respect to the embodiment of FIG. 1.

Figure 3:
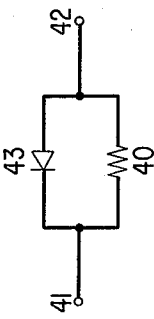

In further accordance with the invention, the structure of FIG. 3 may be used in place of each of the Zener diodes of the embodiment of FIG. 1. FIG. 3 shows a resistor 40 connected between terminals 41 and 42. A conventional diode 43 is also connected between terminals 41 and 42 with the diode being poled for easy current flow from terminal 42 to terminal 41. The voltage drop for current flowing from terminal 41 to terminal 42 is a function of the current and the value of resistor 40, whereas the voltage drop for current flowing from terminal 41 to terminal 42 is relatively small and independent of current. When structures in accordance with FIG. 3 are used in practicing the present invention, they are connected so that current does not flow through the diodes (but instead through the resistor) of any of the structures when the conductor to which that structure is connected comprises the "single" conductor. Furthermore, when structures in accordance with FIG. 3 are used, the values of resistor 40 are chosen so that each is a unique value, thereby introducing unique voltage drops as discussed with respect to the embodiment of FIG. 1.

What is claimed is:

1. In apparatus for testing conductors connected between first and second terminal devices, said apparatus comprising first means for connection to said first terminal device to connect said conductors through substantially identical lamps, respectively, to a common junction point, and second means for connection to said second terminal device to apply a DC potential between any selected one of said conductors and the remainder of said conductors collectively, an improvement comprising:
 a plurality of third means which, in response to current flowing in first and second directions therethrough, have appearing thereacross first and second voltage drops, respectively, where said first voltage drops are all unique with respect to one another for the same value of said first direction currents, said second voltage drops are all substantially equal for said second direction currents within a range of currents and said first voltage drops are greater than said second voltage drops,
 said third means connected in said first means so that when said first means is connected to said first terminal device, said third means are connected in series with said conductors, respectively, and are poled so that all current in one of said first and second directions flows toward said junction point, and
 a current measuring device connected in said second means to measure the current flow produced by said potential.

2. Apparatus in accordance with claim 1 in which said third means comprise Zener diodes having dissimilar breakdown voltages.

3. Apparatus in accordance with claim 1 in which said third means comprise parallel circuits of conventional diodes,
 each of said parallel circuits comprising a plurality of conventional diodes connected in series and poled in the same sense, and an additional conventional diode connected in parallel with said series connected diodes and poled in the opposite sense with respect thereto,
 the number of diodes in each of said pluralities of diodes being unique.

4. Apparatus in accordance with claim 1 in which said third means comprise parallel circuits where each circuit comprises a diode and a resistor connected in parallel and the value of said resistor in each circuit differs from the values of said resistors in all other of said circuits.

5. Apparatus for testing the electrical continuity between terminals on a first device and terminals on a second device where said first device terminals should be connected in a preassigned order to a plurality of conductors and said second device terminals should likewise be connected in a preassigned order to said conductors, said apparatus comprising:
 a plurality of first means, each having first and second terminals, each responsive to a first current flowing in a first direction between said terminals to produce a first voltage drop which is unique to said first voltage drops of all other of said first means and each responsive to a second current flowing in a second direction between said terminals to produce a second voltage drop where all of said second voltage drops of said first means are substantially equal,
 said first means having their first terminals all electrically connected together and their second terminals arranged for connection to said first device terminals, respectively,
 second means for applying a DC potential between any one of said second device terminals and at least one of its remaining terminals, and
 third means for indicating the current flowing from said source.

6. Apparatus in accordance with claim 5 in which said first means comprise Zener diodes having dissimilar breakdown voltages.

7. Apparatus in accordance with claim 5 in which said first means comprise parallel circuits of conventional diodes,
 each of said parallel circuits comprising a plurality of conventional diodes connected in series and poled in the same sense, and an additional conventional diode connected in parallel with said series connected diodes and poled in the opposite sense with respect thereto,
 the number of diodes in each of said pluralities of diodes being unique.

8. Apparatus in accordance with claim 5 in which said first means comprise parallel circuits where each circuit comprises a diode and a resistor connected in parallel and the value of said resistor in each circuit differs from the values of said resistors in all others of said circuits.

9. Apparatus for testing the electrical continuity between terminals on a first device and terminals on a second device where said first device terminals should be connected in a preassigned order to a plurality of conductors and said second device terminals should likewise be connected in a preassigned order to said conductors, said apparatus comprising:
 means comprising a plurality of dissimilar breakdown voltage Zener diode structures each having first and second terminals where said first terminals are all electrically connected together and said second terminals are arranged for connection to said first device terminals, respectively,
 means for applying a DC potential between any one of said second device terminals and at least one of its remaining terminals, and
 means for indicating the current flowing from said source.

* * * * *